United States Patent [19]

Ebzery

[11] Patent Number: 5,444,404
[45] Date of Patent: Aug. 22, 1995

[54] SCAN FLIP-FLOP WITH POWER SAVING FEATURE

[75] Inventor: Thomas J. Ebzery, Andover, Mass.

[73] Assignee: VLSI Technology, Inc., San Jose, Calif.

[21] Appl. No.: 205,921

[22] Filed: Mar. 3, 1994

[51] Int. Cl.$^6$ .................................................. H03K 3/02
[52] U.S. Cl. ..................................... 327/185; 327/202; 326/16; 371/22.1
[58] Field of Search ............... 307/269, 272.1, 272.2, 307/279, 465, 480; 324/73.1; 371/22.1, 22.3, 22.5; 326/16, 48; 327/185, 199, 202, 203, 208, 210, 212, 141

[56] References Cited

U.S. PATENT DOCUMENTS

| | | | |
|---|---|---|---|
| 4,495,629 | 1/1985 | Zasio et al. | 377/70 |
| 5,175,447 | 12/1992 | Kawasaki et al. | 307/480 |

Primary Examiner—Timothy P. Callahan
Assistant Examiner—Jeffrey Zweizig
Attorney, Agent, or Firm—Douglas L. Weller

[57] ABSTRACT

A flip-flop has both a system output and a scan output. A system output signal for the flip-flop is placed on the system output. When the flip-flop is in a normal operating mode, a scan output signal on the scan output is held at a static logic level. When the flip-flop is in a scan mode, the scan output signal on the scan output transitions between logic 1 and logic 0 synchronous with transitions of the system output signal on the system output.

24 Claims, 3 Drawing Sheets

SCAN FLIP-FLOP WITH POWER SAVING FEATURE

BACKGROUND

The present invention concerns the field of flip-flop design and pertains particularly to a flip-flop with a scan output designed to be power efficient.

Testing is an integral part in the designing and manufacturing devices such as integrated circuits. Testing may be performed by placing test vectors within internal registers of the device. The resulting values the device places on its outputs are then monitored to verify proper functioning.

Special flip-flops, called scan flip-flops, may be used to form the internal registers used for testing. For example, scan flip-flops can have multiplexed inputs. This allows the scan flip-flops to receive input from one source during normal operation and from another source during testing.

Scan flip-flops may also employ separate scan-outputs which switch in conjunction with the Q outputs. This allows testing to occur with a minimum impact on normal operation of the circuit. However, the additional power required to drive the separate scan outputs can increase the power dissipation of the circuit.

SUMMARY OF THE INVENTION

In accordance with the preferred embodiment of the present invention, a flip-flop is presented. The flip-flop has both a system output and a scan output. A system output signal for the flip-flop is placed on the system output. When the flip-flop is in a normal operating mode, a scan output signal on the scan output is held at a static logic level. When the flip-flop is in a scan mode, the scan output signal on the scan output transitions between logic 1 and logic 0 synchronous with transitions of the system output signal on the system output.

The present invention may be variously embodied in different types of flip-flops. For example, in many preferred embodiments, a clock input is used to control the timing of transitions of the system output signal. In one preferred embodiment, the static logic level is a logic 1. In another preferred embodiment, the static logic level is a logic 0.

In various preferred embodiments, the flip-flop includes both a system input and a scan input. The system input receives input when the flip-flop is in the normal operating mode. The scan input receives input when the flip-flop is in a scan mode. A mode selection input may be used to select the mode. For example, the flip-flop operates in the normal operating mode in response to a first signal value being placed on the mode selection input. The flip-flop operates in the scan mode in response to a second signal value being placed on the mode selection input. Multiplexing circuitry, connected to a mode selection input, the system input and the scan input, selects either the system input or the scan input.

Various circuitry may be used to generate the scan output signal. For example, in one embodiment of the present invention, the system output signal is inverted to produce an inverted signal output signal. A logic "NOR" is performed on the inverted signal output signal and a signal value of the mode selection input to produce the scan output signal on the scan output. In another embodiment of the present invention, the system output signal is inverted to produce an inverted signal output signal. A logic "NAND" is performed on the inverted signal output signal and a signal value of the mode selection input to produce the scan output signal on the scan output.

The present invention allows for versatile testing while providing power savings over prior art circuits. Particularly, when in normal operating mode, the scan output signal does not toggle and thus does not charge and discharge its load capacitance unnecessarily.

DESCRIPTION OF THE PREFERRED EMBODIMENT

Figure 1:
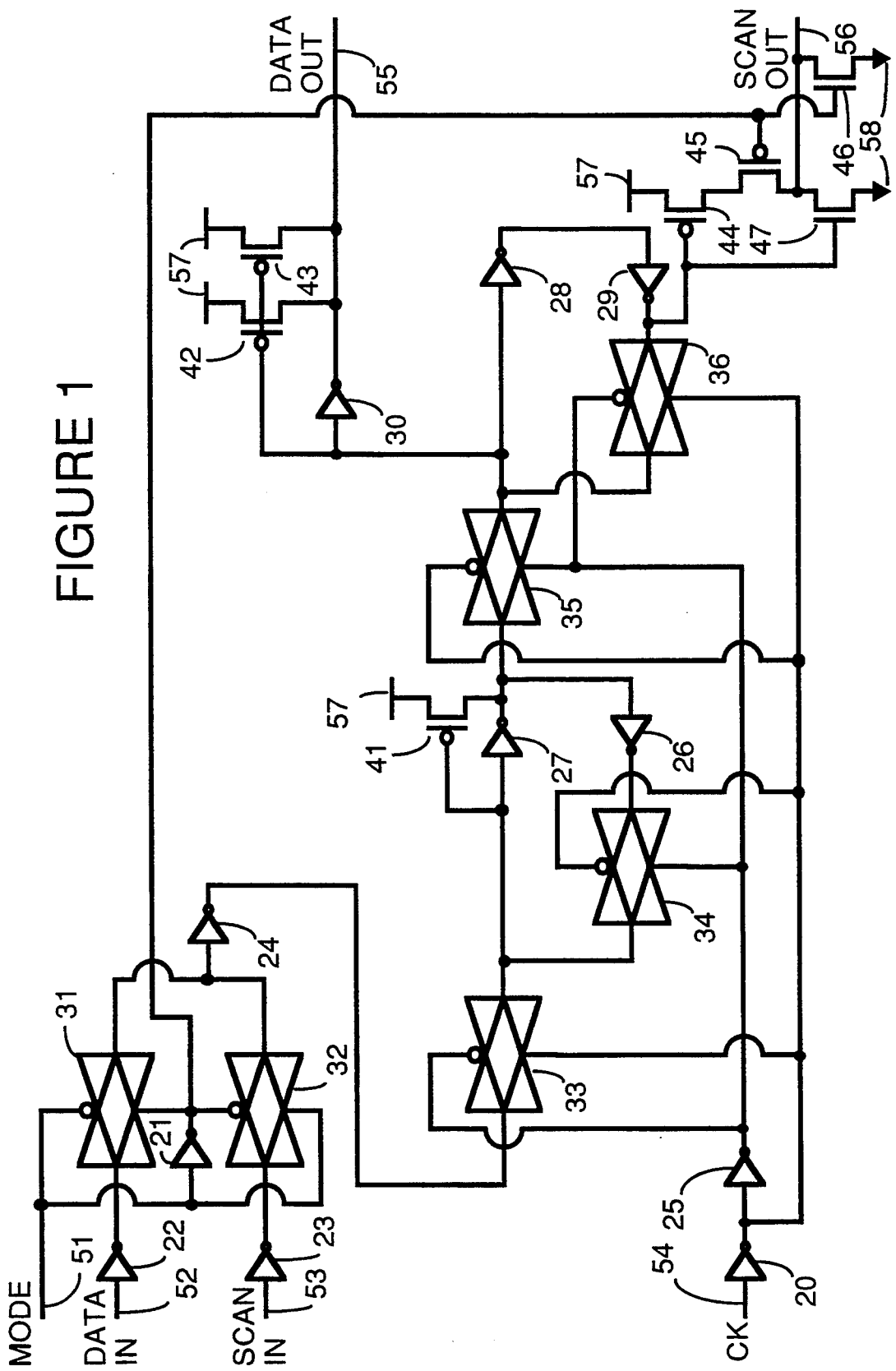
FIG. 1 is a schematic showing a scan flip-flop with multiplexed inputs and a separate scan output in accordance with a preferred embodiment of the present invention.

FIG. 1 is a schematic showing a scan flip-flop with multiplexed inputs and a separate scan output in accordance with a preferred embodiment of the present invention.

The scan flip-flop includes an inverter 20, inverter 21, inverter 22, inverter 23, inverter 24, inverter 25, inverter 26, inverter 27, inverter 28, inverter 29, inverter 30, a CMOS transmission gate 31, a CMOS transmission gate 32, a CMOS transmission gate 33, a CMOS transmission gate 34, a CMOS transmission gate 35, a CMOS transmission gate 36, a p-channel transistor 41, a p-channel transistor 42, a p-channel transistor 43, a p-channel transistor 44, a p-channel transistor 45, an n-channel transistor 46 and an n-channel transistor 47, connected as shown.

A D-input 52 is the input for the scan flip-flop which is used for normal operation. A scan data input 53 is the input for the scan flip-flop which is used to input a scan value to the scan flip-flop. A scan enable input 51 is used to select D-input 52 or the scan data input 53 as the source of input for the scan flip-flop. A clock input 54 provides a clock signal for the scan flip-flop. A power signal 57 of, for example, 5 volts and a ground signal 58 of, for example, 0 volts is connected as shown to various transistors within the scan flip-flop.

When scan enable input 51 is at a logic 0, D-input 52 is selected to provide the source of input for the scan flip-flop. Data on D-input 52 is passed into the scan flip-flop and appears on Q output 55 after a rising clock edge on clock input 54. N-transistor 46 holds scan output 56 at logic 0.

When scan enable input 51 is at logic 1, scan data input 53 is selected to provide the source of input for the scan flip-flop. Data on scan data input 53 is passed into the scan flip-flop and appears on Q output 55 after a rising clock edge on clock input 54. Scan output 56 switches in conjunction with Q-output 55.

As may be understood by evaluation of the logic shown in FIG. 1, inverter 21, inverter 22, inverter 23, CMOS transmission gate 31 and CMOS transmission gate 32 function as a multiplexor within the scan flip-flop. Inverter 21 drives current to control scan output 56. Inverter 20 and inverter 25 buffer and invert the clock signal on clock input 54. CMOS transmission gate 33, CMOS transmission gate 34, CMOS transmission gate 35, CMOS transition gate 36, inverter 26, inverter 27, inverter 28 and inverter 29 are involved in storing and forwarding data within the scan flip-flop. P-channel transistor 41 provides additional drive current for the storage portion. Inverter 30, p-channel transistor 42 and p-channel transistor 43 serve to drive current for Q-output 55. In the preferred embodiment inverter 30 is rated to drive twice the current as other inverters within the scan flip-flop.

P-channel transistor 44, p-channel transistor 45, n-channel transistor 46 and n-channel transistor 47 act as a logic "NOR gate" to control and drive output to scan output 56. Under normal operation, scan enable input 51 is at a logic 0 and n-transistor 46 holds scan output 56 at logic 0. During testing, scan enable input 51 is at logic 1 and scan output 56 switches in conjunction with Q-output 55. This results in a power savings since scan output 56 does not toggle under normal operation (normal operating mode) and thus does not charge and discharge its load capacitance unnecessarily.

Figure 2:
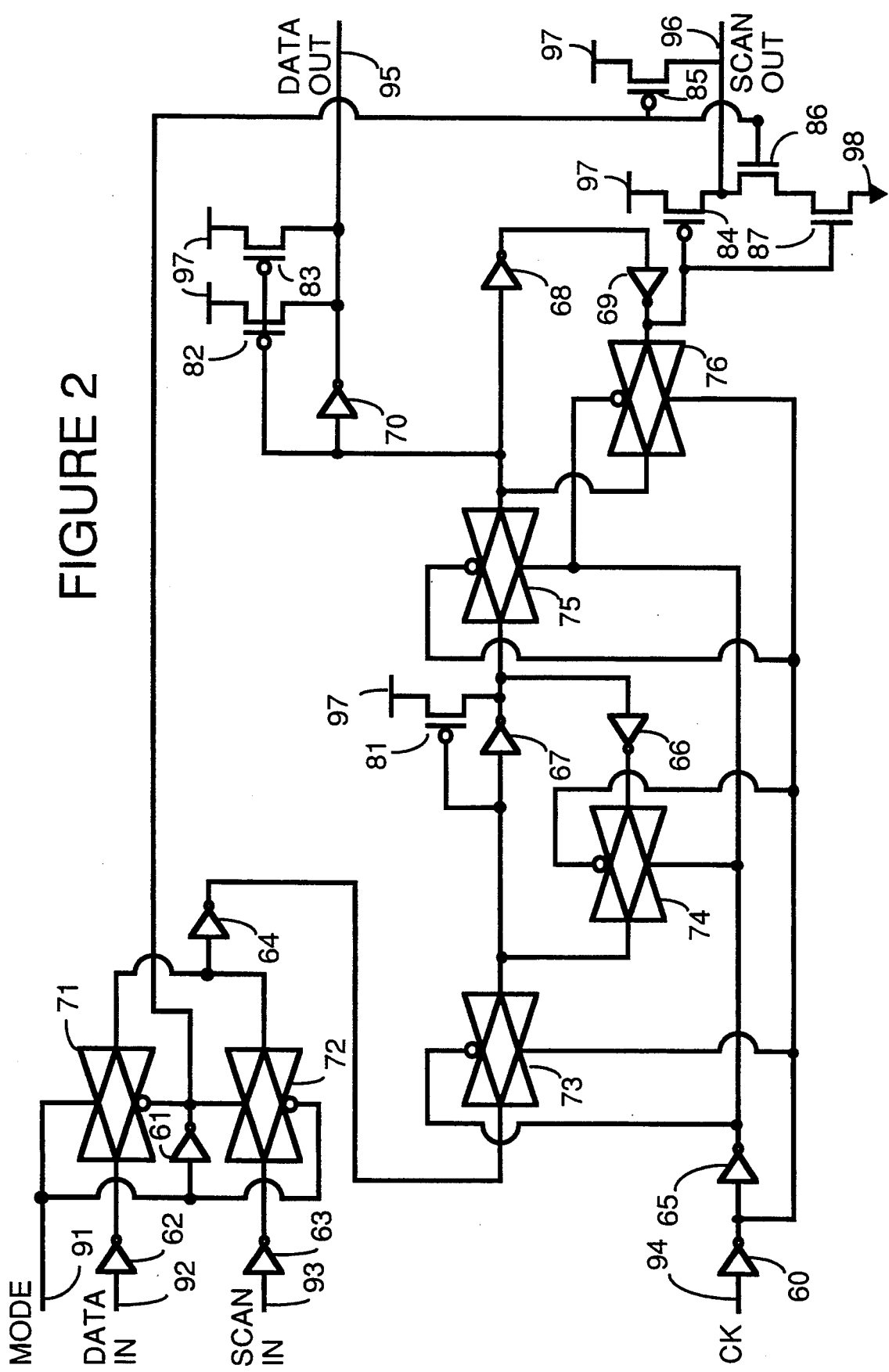
FIG. 2 is a schematic showing a scan flip-flop with multiplexed inputs and a separate scan output in accordance with an alternate preferred embodiment of the present invention.

FIG. 2 is a schematic showing another scan flip-flop with multiplexed inputs and a separate scan output in accordance with an alternate preferred embodiment of the present invention.

The scan flip-flop includes an inverter 60, inverter 61, inverter 62, inverter 63, inverter 64, inverter 65, inverter 66, inverter 67, inverter 68, inverter 69, inverter 70, a CMOS transmission gate 71, a CMOS transmission gate 72, a CMOS transmission gate 73, a CMOS transmission gate 74, a CMOS transmission gate 75, a CMOS transmission gate 76, a p-channel transistor 81, a p-channel transistor 82, a p-channel transistor 83, a p-channel transistor 84, a p-channel transistor 85, an n-channel transistor 86 and an n-channel transistor 87.

A D-input 92 is the input for the scan flip-flop which is used for normal operation. A scan data input 93 is the input for the scan flip-flop which is used to input a scan value to the scan flip-flop. A scan enable input 91 is used to select D-input 92 or the scan data input 93 as the source of input for the scan flip-flop. A clock input 94 provides a clock signal for the scan flip-flop. A power signal 97 of, for example, 5 volts and a ground signal 98 of, for example, 0 volts is connected as shown to various transistors within the scan flip-flop.

When scan enable input 91 is at logic 1, D-input 92 is selected to provide the source of input for the scan flip-flop. Data on D-input 92 is passed into the scan flip-flop and appears on Q output 95 after a rising clock edge on clock input 94. P-transistor 85 holds scan output 96 at logic 1.

When scan enable input 91 is at logic 0, scan data input 93 is selected to provide the source of input for the scan flip-flop. Data on scan data input 93 is passed into the scan flip-flop and appears on Q output 95 after a rising clock edge on clock input 94. Scan output 96 switches in conjunction with Q-output 95.

As may be understood by evaluation of the logic shown in FIG. 2, inverter 61, inverter 62, inverter 63, CMOS transmission gate 71 and CMOS transmission gate 72 function as a multiplexor within the scan flip-flop. Inverter 61 drives current to control scan output 96. Inverter 60 and inverter 65 buffer and invert the clock signal on clock input 94. CMOS transmission gate 73, CMOS transmission gate 74, CMOS transmission gate 75, CMOS transition gate 76, inverter 66, inverter 67, inverter 68 and inverter 69 are involved in storing and forwarding data within the scan flip-flop. P-channel transistor 81 provides additional drive current for the storage portion. Inverter 70, p-channel transistor 82 and p-channel transistor 83 serve to drive current for Q-output 95. In the preferred embodiment inverter 70 is rated to drive twice the current as other inverters within the scan flip-flop.

P-channel transistor 84, p-channel transistor 85, n-channel transistor 86 and n-channel transistor 87 act as a logic "NAND gate" to control and drive output to scan output 96. Under normal operation, scan enable input 91 is at logic 1 and p-transistor 85 holds scan output 96 at logic 1. During testing, scan enable input 91 is at logic 0 and scan output 96 switches in conjunction with Q-output 95. This results in a power savings since scan output 96 does not toggle under normal operation (normal operating mode) and thus does not charge and discharge its load capacitance unnecessarily.

Figure 3:
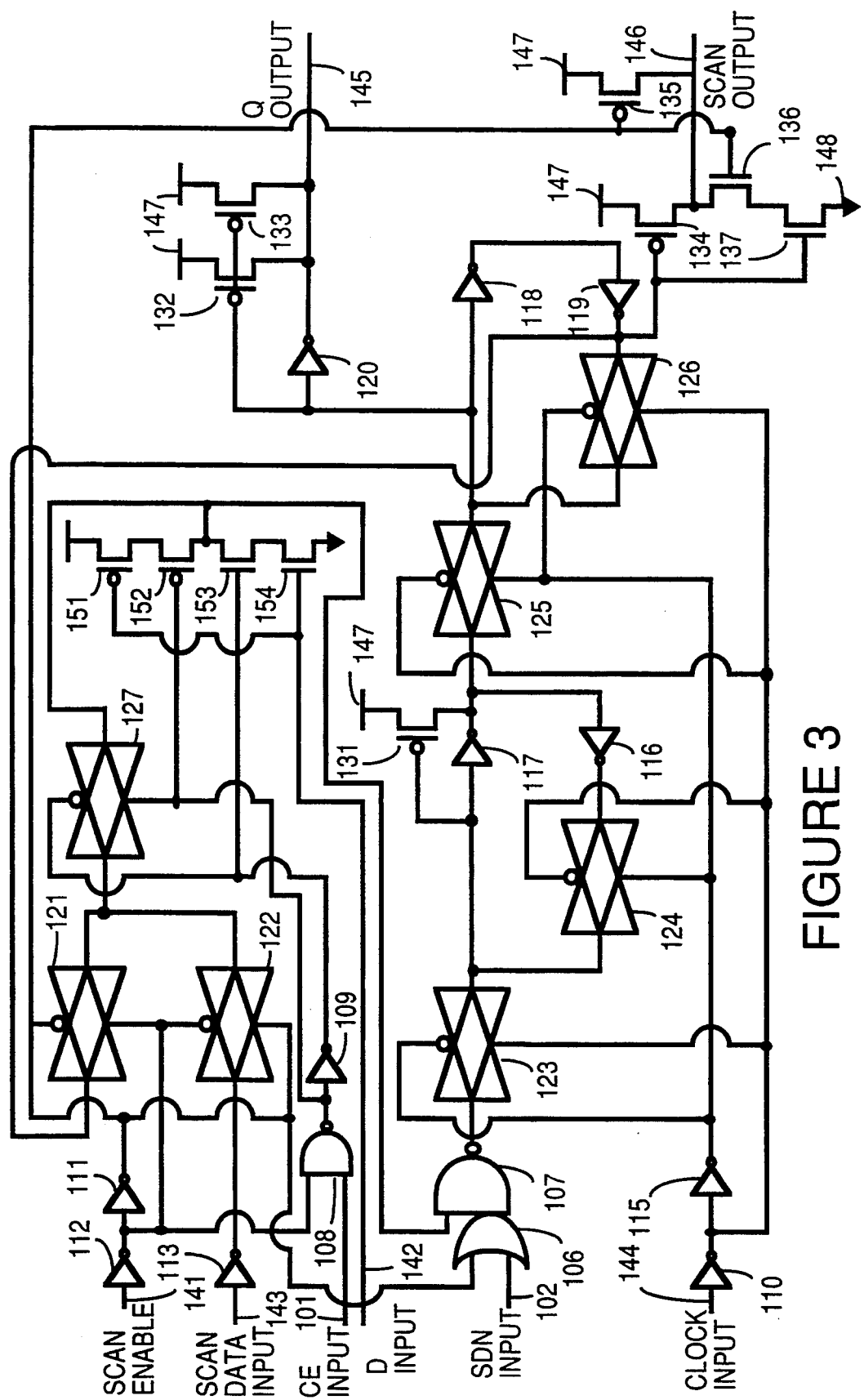
FIG. 3 is a schematic showing a scan flip-flop with multiplexed inputs and a separate scan output in accordance with another alternate preferred embodiment of the present invention.

The present invention may be extended to all types of scan flip-flops. For example, FIG. 3 is a schematic showing a scan flip-flop with multiplexed inputs, a separate scan output, a data hold feature and synchronous preset in accordance with another alternate preferred embodiment of the present invention.

The scan flip-flop includes an inverter 109, an inverter 110, inverter 111, inverter 112, inverter 113, inverter 114, inverter 115, inverter 116, inverter 117, inverter 118, inverter 119, inverter 120, a CMOS transmission gate 121, a CMOS transmission gate 122, a CMOS transmission gate 123, a CMOS transmission gate 124, a CMOS transmission gate 125, a CMOS transmission gate 126, a CMOS transmission gate 127, a p-channel transistor 131, a p-channel transistor 132, a p-channel transistor 133, a p-channel transistor 134, a p-channel transistor 135, an n-channel transistor 136, an n-channel transistor 137, a p-channel transistor 151, a p-channel transistor 152, an n-channel transistor 153, an n-channel transistor 154, a logic OR gate 106, a logic NAND gate 107 and a logic NAND gate 108.

A D-input 142 is the input for the scan flip-flop which is used for normal operation. A scan data input 143 is the input for the scan flip-flop which is used to input a scan value to the scan flip-flop. A third source of data comes from the output of inverter 119 (for the data hold feature in normal operation). A scan enable input 141 is used to select between normal mode or scan mode. In normal mode, either D-input 142 or the data hold input from 119 is selected as the source of input for the scan flip-flop. In the scan mode, the scan data input 143 is selected as the source of input for the scan flip-flop. A clock input 144 provides a clock signal for the scan flip-flop. A power signal 147 of, for example, 5 volts and a ground signal 148 of, for example, 0 volts is connected as shown to various transistors within the scan flip-flop. In addition, CE input 101 selects between D input 142 and the data hold input from inverter 119. SDN input 102 is used to force the loading of logic 1 into the scan flip-flop in normal mode. Both CE input 101 and SDN input 102 are ignore in scan mode.

When scan enable input 141 is at a logic 0, D -input 142 or data hold input from inverter 119 is selected to provide the source of input for the scan flip-flop. The selected data is passed into the scan flip-flop and appears on Q output 145 after a rising clock edge on clock input 144. P-transistor 135 holds scan output 146 at logic 1.

When scan enable input 141 is at logic 1, scan data input 143 is selected to provide the source of input for the scan flip-flop. Data on scan data input 143 is passed into the scan flip-flop and appears on Q output 145 after a rising clock edge on clock input 144. Scan output 146 switches in conjunction with Q-output 145.

As may be understood by evaluation of the logic shown in FIG. 3, inverter 111, inverter 112, inverter 113, CMOS transmission gate 121 and CMOS transmission gate 122 function as a multiplexor within the scan flip-flop. Inverter 110 and inverter 115 buffer and invert the clock signal on clock input 144. CMOS transmission gate 123, CMOS transmission gate 124, CMOS transmission gate 125, CMOS transition gate 126, inverter 116, inverter 117, inverter 118 and inverter 119 are involved in storing and forwarding data within the scan flip-flop. P-channel transistor 131 provides additional drive current for the storage portion. Inverter 120, p-channel transistor 132 and p-channel transistor 133 serve to drive current for Q-output 145. In the preferred embodiment inverter 120 is rated to drive twice the current as other inverters within the scan flip-flop. P-channel transistor 151, p-channel transistor 152, n-channel transistor 153, n-channel transistor 154, CMOS transmission gate 127, NAND gate 108, inverter 109 form a second multiplexor. Logic NAND gate 107 provides a means for SDN input 102 to force the loading of a logic one into the scan flip-flop when a logic 0 is placed on SDN input 102. Logic OR gate 106 inhibits the operation of SDN input 102 when the scan flip-flop is in scan mode.

P-channel transistor 134, p-channel transistor 135, n-channel transistor 136 and n-channel transistor 137 act as a logic "NAND gate" to control and drive output to scan output 146. Under normal operation, scan enable input 141 is at a logic 0 and p-transistor 135 holds scan output 146 at logic 1. During testing, scan enable input 141 is at logic 1 and scan output 146 switches in conjunction with Q-output 145. This results in a power savings since scan output 146 does not toggle under normal operation (normal operating mode) and thus does not charge and discharge its load capacitance unnecessarily.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A scan flip-flop comprising:
   a system input for receiving input when the scan flip-flop is in a normal operating mode;
   a scan input for receiving input when the scan flip-flop is in a scan mode;
   a mode selection input, the scan flip-flop being in the normal operating mode in response to a first signal value being placed on the mode selection input and the scan flip-flop being in the scan mode in response to a second signal value being placed on the mode selection input;
   a system output on which output for the scan flip-flop is placed;
   a scan output; and,
   an output generating means, coupled to the system input, the scan input, the mode selection means, the system output and the scan output, for generating a system output signal on the system output and a scan output signal on the scan output, wherein when the scan flip-flop is in the normal operating mode, the scan output signal is held at a logic 1 and when the scan flip-flop is in scan mode, the scan output signal transitions between logic 1 and logic 0 synchronous with transitions of the system output signal on the system output.

2. A scan flip-flop as in claim 1 additionally comprising a clock input coupled to the output generating means, timing of transitions of the system output signal being controlled by a clock signal placed on the clock input.

3. A scan flip-flop as in claim 1 wherein the output generation means includes:
   multiplexing circuitry coupled to the mode selection input, the system input and the scan input, the multiplexing circuitry in response to the first signal value being placed on the mode selection input selecting the system input and the multiplexing circuitry in response to the second signal value being placed on the mode selection input selecting the scan input.

4. A scan flip-flop as in claim 1 wherein the output generation means includes:
   system output circuitry for driving the system output signal onto the system output; and,
   scan output circuitry for driving the scan output signal onto the scan output, the scan output circuitry including a first input coupled to an input of the system output circuitry and a second input coupled to the mode selection input, the scan output circuitry inverting the system output signal to produce an inverted signal output signal and the scan output circuitry performing a logic "NOR" on the inverted signal output signal and a signal value of the mode selection input to produce the scan output signal on the scan output.

5. A scan flip-flop as in claim 1 wherein the output generation means includes:
   system output circuitry for driving the system output signal onto the system output; and,
   scan output circuitry for driving the scan output signal onto the scan out, the scan output circuitry including a first input coupled to an input of the system output circuitry and a second input coupled to the mode selection input, the scan output circuitry inverting the system output signal to produce an inverted signal output signal and the scan output circuitry performing a logic "NAND" on the inverted signal output signal and a signal value of the mode selection input to produce the scan output signal on the scan output.

6. A method for providing output from a scan flip-flop having a system output and a scan output, the method comprising the steps of:
   (a) generating a system output signal on the system output of the scan flip-flop; and,
   (b) generating a scan output signal on the scan output, including the substeps of:
      (b.1) when the scan flip-flop is in a normal operating mode, holding the scan output signal at a logic 1, and
      (b.2) when the scan flip-flop is in a scan mode, causing the scan output signal to transition between logic 1 and logic 0 synchronous with transitions of the system output signal on the system output.

7. A method as in claim 6 wherein step (b) additionally comprises the substeps off
   (b.3) when the scan flip-flop is in the normal operating mode, receiving input into the scan flip-flop from a system input, and
   (b.4) when the scan flip-flop is in the scan mode, receiving input into the scan flip-flop from a scan input.

8. A flip-flop comprising:
   a system output;
   a scan output;
   system output signal generating means, coupled to the system output, for generating a system output signal on the system output; and,
   scan output signal generating means, coupled to the scan output, for generating a scan output signal on the scan output, wherein when the flip-flop is in a normal operating mode, the scan output signal generating means holds the scan output signal at a logic 1, and wherein when the flip-flop is in a scan mode, the scan output signal generating means causes the scan output signal to transition between logic 1 and logic 0 synchronous with transitions of the system output signal on the system output.

9. A flip-flop as in claim 8 additionally comprising a clock input coupled to the system output signal generating means, timing of transitions of the system output signal being controlled by a clock signal placed on the clock input.

10. A flip-flop as in claim 8 additionally comprising:
    a system input for receiving input when the flip-flop is in a normal operating mode;
    a scan input for receiving input when the flip-flop is in a scan mode;
    a mode selection input, the flip-flop being in the normal operating mode in response to a first signal value being placed on the mode selection input and the flip-flop being in the scan mode in response to a second signal value being placed on the mode selection input; and,
    multiplexing circuitry coupled to the mode selection input, the system input and the scan input, the multiplexing circuitry in response to the first signal value being placed on the mode selection input selecting the system input and the multiplexing circuitry in response to the second signal value being placed on the mode selection input selecting the scan input.

11. A flip-flop as in claim 10 wherein the scan output signal generating means includes:
    a first input coupled to an input of the system output signal generating means and a second input coupled to the mode selection input, wherein the scan output signal generating means inverts the system output signal to produce an inverted signal output signal and the scan output signal generating means performs a logic "NOR" on the inverted signal output signal and a signal value of the mode selection input to produce the scan output signal on the scan output.

12. A flip-flop as in claim 10 wherein the scan output signal generating means includes:
    a first input coupled to an input of the system output signal generating means and a second input coupled to the mode selection input, wherein the scan output signal generating means inverts the system output signal to produce an inverted signal output signal and the scan output signal generating means performs a logic "NAND" on the inverted signal output signal and a signal value of the mode selection input to produce the scan output signal on the scan output.

13. A scan flip-flop comprising:
    a system input for receiving input when the scan flip-flop is in a normal operating mode;
    a scan input for receiving input when the scan flip-flop is in a scan mode;
    a mode selection input, the scan flip-flop being in the normal operating mode in response to a first signal value being placed on the mode selection input and the scan flip-flop being in the scan mode in response to a second signal value being placed on the mode selection input;
    a system output on which output for the scan flip-flop is placed;
    a scan output; and,
    an output generating means, coupled to the system input, the scan input, the mode selection means, the system output and the scan output, for generating a system output signal on the system output and a scan output signal on the scan output, wherein when the scan flip-flop is in the normal operating mode, the scan output signal is held at a logic 0 and when the scan flip-flop is in scan mode, the scan output signal transitions between logic 1 and logic 0 synchronous with transitions of the system output signal on the system output.

14. A scan flip-flop as in claim 13 additionally comprising a clock input coupled to the output generating means, timing of transitions of the system output signal being controlled by a clock signal placed on the clock input.

15. A scan flip-flop as in claim 13 wherein the output generation means includes:
    multiplexing circuitry coupled to the mode selection input, the system input and the scan input, the multiplexing circuitry in response to the first signal value being placed on the mode selection input selecting the system input and the multiplexing circuitry in response to the second signal value being placed on the mode selection input selecting the scan input.

16. A scan flip-flop as in claim 13 wherein the output generation means includes:
    system output circuitry for driving the system output signal onto the system output; and,
    scan output circuitry for driving the scan output signal onto the scan output, the scan output circuitry including a first input coupled to an input of the system output circuitry and a second input coupled to the mode selection input, the scan output circuitry inverting the system output signal to produce an inverted signal output signal and the scan output circuitry performing a logic "NOR" on the inverted signal output signal and a signal value of the mode selection input to produce the scan output signal on the scan output.

17. A scan flip-flop as in claim 13 wherein the output generation means includes:
    system output circuitry for driving the system output signal onto the system output; and,
    scan output circuitry for driving the scan output signal onto the scan out, the scan output circuitry including a first input coupled to an input of the system output circuitry and a second input coupled to the mode selection input, the scan output circuitry inverting the system output signal to produce an inverted signal output signal and the scan output circuitry performing a logic "NAND" on the inverted signal output signal and a signal value of the mode selection input to produce the scan output signal on the scan output.

18. A method for providing output from a scan flip-flop having a system output and a scan output, the method comprising the steps off
   (a) generating a system output signal on the system output of the scan flip-flop; and,
   (b) generating a scan output signal on the scan output, including the substeps of:
      (b.1) when the scan flip-flop is in a normal operating mode, holding the scan output signal at a logic 0, and
      (b.2) when the scan flip-flop is in a scan mode, causing the scan output signal to transition between logic 1 and logic 0 synchronous with transitions of the system output signal on the system output.

19. A method as in claim 18 wherein step (b) additionally comprises the substeps of:
   (b.3) when the scan flip-flop is in the normal operating mode, receiving input into the scan flip-flop from a system input, and
   (b.4) when the scan flip-flop is in the scan mode, receiving input into the scan flip-flop from a scan input.

20. A flip-flop comprising:
   a system output;
   a scan output;
   system output signal generating means, coupled to the system output, for generating a system output signal on the system output; and,
   scan output signal generating means, coupled to the scan output, for generating a scan output signal on the scan output, wherein when the flip-flop is in a normal operating mode, the scan output signal generating means holds the scan output signal at a logic 0, and wherein when the flip-flop is in a scan mode, the scan output signal generating means causes the scan output signal to transition between logic 1 and logic 0 synchronous with transitions of the system output signal on the system output.

21. A flip-flop as in claim 20 additionally comprising a clock input coupled to the system output signal generating means, timing of transitions of the system output signal being controlled by a clock signal placed on the clock input.

22. A flip-flop as in claim 20 additionally comprising:
   a system input for receiving input when the flip-flop is in a normal operating mode;
   a scan input for receiving input when the flip-flop is in a scan mode;
   a mode selection input, the flip-flop being in the normal operating mode in response to a first signal value being placed on the mode selection input and the flip-flop being in the scan mode in response to a second signal value being placed on the mode selection input; and,
   multiplexing circuitry coupled to the mode selection input, the system input and the scan input, the multiplexing circuitry in response to the first signal value being placed on the mode selection input selecting the system input and the multiplexing circuitry in response to the second signal value being placed on the mode selection input selecting the scan input.

23. A flip-flop as in claim 22 wherein the scan output signal generating means includes:
   a first input coupled to an input of the system output signal generating means and a second input coupled to the mode selection input, wherein the scan output signal generating means inverts the system output signal to produce an inverted signal output signal and the scan output signal generating means performs a logic "NOR" on the inverted signal output signal and a signal value of the mode selection input to produce the scan output signal on the scan output.

24. A flip-flop as in claim 22 wherein the scan output signal generating means includes:
   a first input coupled to an input of the system output signal generating means and a second input coupled to the mode selection input, wherein the scan output signal generating means inverts the system output signal to produce an inverted signal output signal and the scan output signal generating means performs a logic "NAND" on the inverted signal output signal and a signal value of the mode selection input to produce the scan output signal on the scan output.

* * * * *